United States Patent [19]

Bonneau et al.

[11] Patent Number: 4,510,623

[45] Date of Patent: Apr. 9, 1985

[54] TELEVISION CHANNEL LOCKOUT

[75] Inventors: Paul Bonneau, Portsmouth; Howard E. Holshouser, Suffolk; Terrence E. Rogers, Portsmouth, all of Va.

[73] Assignee: General Electric Company, Portsmouth, Va.

[21] Appl. No.: 401,175

[22] Filed: Jul. 23, 1982

[51] Int. Cl.³ .................. H04B 1/16; H04N 5/44; H04N 7/16
[52] U.S. Cl. ................... 455/181; 455/183; 455/186; 455/151; 455/158; 358/191.1; 358/114
[58] Field of Search ............... 455/158, 179, 166, 181, 455/185, 186, 183, 151; 358/191.1, 114, 122

[56] References Cited

U.S. PATENT DOCUMENTS

| 4,228,543 | 10/1980 | Jackson et al. | 455/181 |
| 4,232,396 | 11/1980 | Grimes | 455/179 |
| 4,317,213 | 2/1982 | DiLorenzo | 455/1 |
| 4,355,415 | 10/1982 | George et al. | 455/166 |
| 4,375,651 | 3/1983 | Templin et al. | 455/186 |
| 4,425,579 | 1/1984 | Merrell | 455/186 |

Primary Examiner—Jin F. Ng

[57] ABSTRACT

An electronically tuned television receiver is provided with a channel lockout feature to control viewer program selection. The television receiver has a tuner local oscillator (101), the frequency of which is controlled by a phase lock loop (12) having a programmable frequency divider (122,123). A microprocessor receives a user input from a keyboard (14) or remote transmitter (15) indicating a desired channel. In response to this input, the microprocessor normally loads a programmable constant in the programmable frequency divider to cause the tuner (10) to be tuned to the desired channel. However, the microprocessor is programmed to respond to a user entered lockout code sequence to store in a non-volatile memory (19) one or more channels to be inhibited for a predetermined period of time. Should a user input indicate one of the inhibited channels, the microprocessor does not load the corresponding programmable constant in the programmable frequency divider with the result that the television receiver continues to receive the last valid channel selected. Once the predetermined period of time has elapsed, the non-volatile memory is cleared of the inhibited channels, and the television receiver reverts to normal tuning operation for all channels. The microprocessor is further programmed to respond to a security code to permit viewing of an inhibited channel during the time that channel is locked out. In addition, the microprocessor is programmed to respond to a master key code to permit clearing of all inhibited channels stored in the non-volatile memory.

23 Claims, 7 Drawing Figures

TELEVISION CHANNEL LOCKOUT

BACKGROUND OF THE INVENTION

The present invention generally relates to electronically tuned receivers, and more particularly to a television tuning system provided with a channel lockout feature to control viewer program selection.

The content of certain television programs has been found to be objectionable by some parents of young children. In order to prevent their children from viewing such programs, parents often supervise their children's use of the television by specifying those programs which can be viewed and/or the times during which the television can be operated. However, direct supervision may not always be possible or enforceable. As a result, various approaches have been proposed to inhibit or interefere with the reception of those channels on which the objectionable programs are broadcast or transmitted.

One approach is described in U.S. Pat. No. 4,232,396, which issued to A. S. Grimes. According to the Grimes patent, a plurality of individual circuits, each comprising at least one impedance element in series with a switch, is utilized. The individual series of circuits are all disposed in parallel and are connected to a single master switch in series therewith. Any one or more individual series circuit switches may be closed, and when the master series switch is closed, the impedance elements disposed in electrical relationship with one another either present a series impedance with the RF signal or shift the frequency of the local oscillator so as to preclude the receiver from operating on one or more selected channels. The user is thereby permitted to operate one or more individual channel disabling switches, either singly or in combination, such that when such switches are operated, and the master switch is also operated, those channels desired to be maintained inoperable are effectively disabled.

In another approach described in U.S. Pat. No. 4,317,213, issued to M. DiLorenzo, a device is connected to the television receiver to selectively interfere with the reception of selected channels. This device includes a number of signal generating circuits, each respectively set to generate a signal substantially equal to the carrier frequency of a corresponding television broadcast signal, and a timer which can be preset to activate and deactivate selected oscillations on a timed basis. The signal generating circuits are coupled to the antenna input leads of the television receiver so that when activated, the signals produced thereby cause sufficient interference with the corresponding incoming television broadcast signal to effectively block reception.

While the approaches taken by Grimes and DiLorenzo are effective to inhibit or interfere with the reception of those channels which are desired to be blocked, both require a substantial amount of additional hardware and either a modification of the television receiver or the connection of an external device to the television receiver. Also, it is noted that it is relatively easy to defeat or disconnect these systems. Therefore, it is apparent that what is still needed is a channel lockout feature for a television receiver which does not require substantial additional hardware and which is secure, i.e., cannot be easily defeated by someone not permitted to view the locked out channels.

SUMMARY OF THE INVENTION

It is therefore an object of the present invention to provide a channel lockout feature for a television receiver, or a tuner thereof, to secure certain channels and thereby control viewer program selection.

It is another object of the invention to provide a channel or signal lockout system in electronically controlled tuners without substantially increasing their manufacturing costs.

It is a further object of the instant invention to provide a television channel lockout system which is fool proof in operation. More particularly, it is an object of the invention to provide such a system wherein failure to follow the correct lockout procedure will not result in an undesired disabling of the television receiver.

The foregoing and other objects of the invention are attained in an electronically tuned television receiver. Such a receiver has a tuner local oscillator, the frequency of which is controlled by a phase lock loop having a programmable frequency divider. A microprocessor receives a user input from a keyboard or remote transmitter indicating a desired channel. In response to this input, the microprocessor normally loads a programmable constant in the programmable frequency divider to cause the tuner to be tuned to the desired channel. However, the microprocessor is programmed to respond to a user entered lockout code sequence to store in a non-volatile memory one or more channels to be inhibited for a predetermined period of time. Should a user input indicate one of the inhibited channels, the microprocessor does not load the corresponding programmable constant in the programmable frequency divider with the result that the television receiver continues to receive the last valid channel selected. Once the predetermined period of time has elapsed, the non-volatile memory is cleared of the inhibited channels, and the television receiver reverts to normal tuning operation for all channels. The microprocessor is further programmed to respond to a user defined security code, also stored in the non-volatile memory, to permit viewing of an inhibited channel during the time that channel is locked out. In addition, the microprocessor is firmly programmed to respond to a master key code to permit clearing of all inhibiting channels stored in the non-volatile memory.

BRIEF DESCRIPTION OF THE DRAWINGS

The specific nature of the invention, as well as other objects, aspects, uses and advantages thereof, will clearly appear from the following description and from the accompanying drawings, in which.

DESCRIPTION OF THE PREFERRED EMBODIMENT

The channel lockout feature of the invention described herein is a software and hardware combination of the microprocessor and non-volatile memory and the phase lock loop circuit in an electronic tuner of a television receiver. In the embodiment to be described the invention is incorporated in a conventional receiver wherein the display device, e.g., a TV tube, speakers and signal processing circuits are located within a single cabinet. However, it should be borne in mind that television receivers of the future may be made up of separately sold components and the invention herein may be incorporated in the tuning subcomponents of the system or in another component for interaction therewith.

Figure 1:
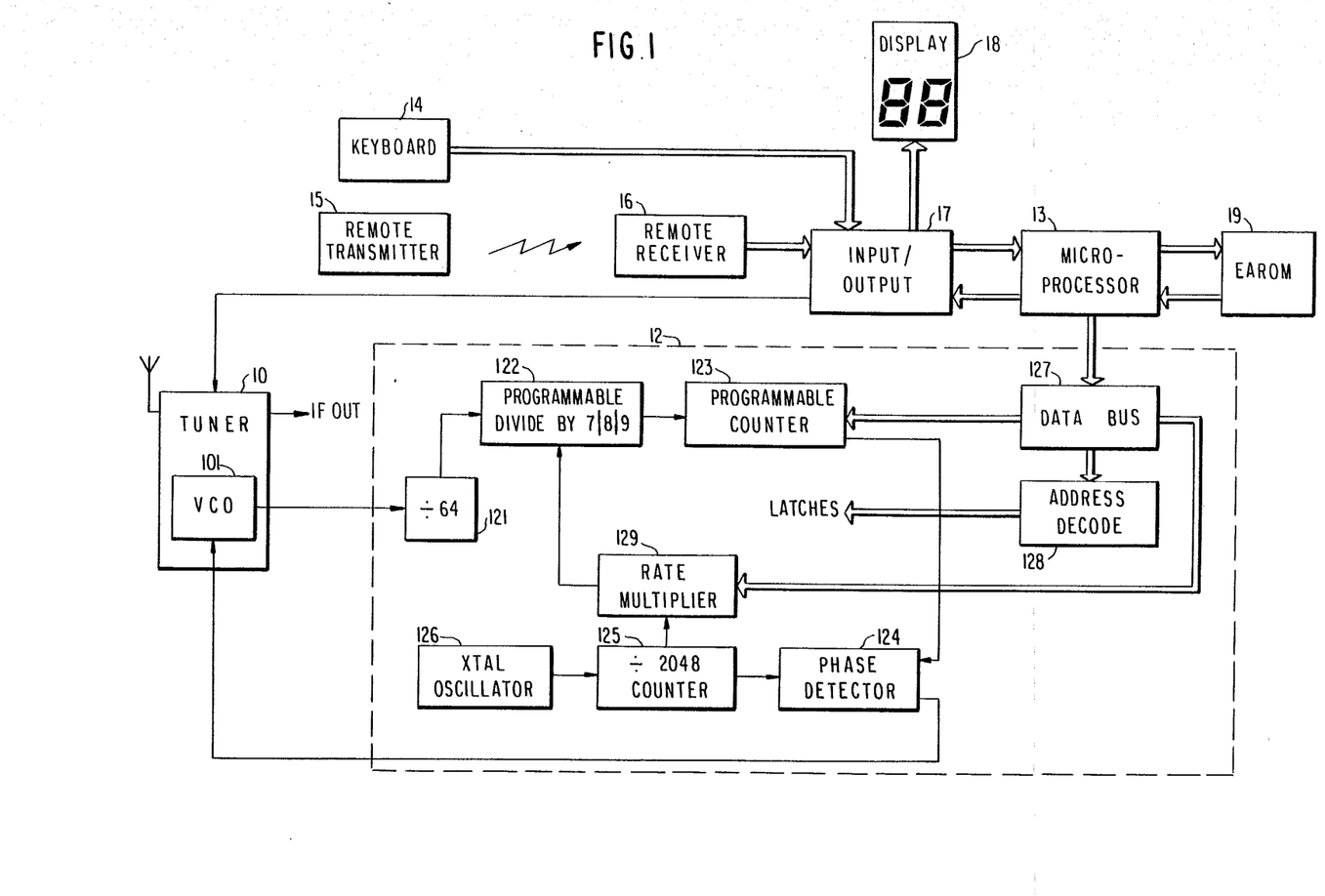
FIG. 1 is a block diagram of a tuning system in which the present invention is used.

In order to understand how the channel lockout feature works, it is desirable to understand how an electronically tuned television receiver functions. Reference is made to FIG. 1 which illustrates a tuning system block diagram. The television receiver includes a UHF/VHF tuner 10 which is connected either to an antenna, as illustrated, or to a cable television system. The tuner includes a local oscillator 101 which is a voltage controlled oscillator (VCO). The output of the tuner 10 is an intermediate frequency (IF) which is supplied to the IF circuits of the television receiver. The tuning voltage which controls the oscillation frequency of the VCO is supplied by a phase lock loop (PLL) 12. The input to the PLL 12 is an output of the VCO 101. This input is divided by sixty-four in frequency divider 121 and supplied to a programmable divide by seven/eight/nine frequency divider 122. The output of frequency divider 122 is supplied to a programmable counter 123, the output of which is supplied to a phase detector 124. The other input to the phase detector 124 is supplied by a divide by 2048 counter 125 which receives as its input a 4 MHz signal from crystal oscillator 126. The output of the phase detector 124, which includes appropriate filtering, is the tuning voltage supplied to the VCO 101.

The different channels of the television receiver can be tuned by varying the local oscillator frequency of the tuner. For example, channel 2 has a picture carrier frequency of 55.25 MHz. If this signal is mixed with the local oscillator signal, an output will appear at the IF output of the tuner having carrier signals in the form of $$A_1 \cos 2\pi(LO-RF_{IN})t + A_2 \cos 2\pi(LO+RF_{IN})t,$$

where $A_1$ and $A_2$ are constants, LO is the local oscillator frequency and $RF_{IN}$ is the carrier frequency of the desired channel. If the IF circuitry has a band pass filter that will pass only frequencies in the range of 45.75 MHz and related information sidebands, the second term of the above equation is eliminated leaving only the first term $A_1 \cos 2\pi(LO-RF_{IN})t$. This term will only pass through the IF circuitry effectively if the frequency of this term substantially equals 45.75 MHz or $LO-RF_{IN}=45.75$ MHz. In selecting channel 2, it is given that $RF_{IN}=55.25$ MHz, so therefore the local oscillator frequency must be 101 MHz to satisfy the IF pass band requirements. If channel 3 is selected, $RF_{IN}=61.25$ MHz, and therefore, the local oscillator frequency must be 107 MHz. A similar analysis can be made for all the channels, and it will be appreciated that the different channels can be accessed by varying the local oscillator frequency. Therefore, the objective of the electronic tuning system is to control the local oscillator frequency.

This control of the local oscillator is done by the PLL 12 which divides the VCO 101 output frequency by some programmable constant and compares this divided down frequency to a stable fixed reference such as 1.953125 KHz. If the divided down frequency is too low, the tuning voltage at the output of the phase detector 124 will be increased until the VCO 101 reaches the correct frequency. If the divided down frequency is too high, the tuning voltage from the output of the phase detector 124 will be decreased until the VCO 101 reaches the correct frequency. Different channels can be accessed by changing the programmable constant for division. This information, the programmable constant, is controlled by the microprocessor 13. This it does by supplying data and load commands to the PLL 12 via the PLL data buss 127. The data or programmable constant is supplied via the data buss 127 to the programmable counter 123 and to a rate multiplier 129, the latter controlling the frequency divider 122. The output of the data buss is also supplied to the address decoder 128 which controls the input latches (not shown) to the programmable counter 123 and the rate multiplier 129. The description of the PLL 12 has been brief because such a device may be purchased as an off-the-shelf item, i.e., TD6306P, from Toshiba Corporation, and literature on the device is readily available.

The heart of the electronic tuning system is the microprocessor 13 which controls all of the functions of the tuning system. The microprocessor controls what channel is tuned by sending a programmable constant to the PLL 12. If the programmable constant is not sent to the PLL 12, the channel will not change. The microprocessor 13 receives commands from the user via the control panel keyboard 14 or the remote transmitter 15. The remote transmitter 15 is typically an infrared (IR) transmitter which transmits a pulse code modulated (PCM) signal in response to one or more function keys being depressed. A remote IR receiver 16 responds to the transmitted PCM pulses and provides an output to the microprocessor 13. The user commands from the keyboard 14 or the remote receiver 16 are supplied to the microprocessor 13 via an input/output (I/O) circuit 17. The microprocessor 13 acts on the commands received to produce power control for the receiver, audio control voltages, tuning and band switching voltages, light emitting diode (LED) display data for channel identification, and frequency data for PLL operation. The LED display data is supplied by the microprocessor 13 via the I/O 17 to the display 18. The frequency data for PLL operation may be derived in part from an electronically alterable read only memory (EAROM) 19 which is a non-volatile memory. This memory would be used to store, for example, the last channel received prior to power interruption so that, when the power is turned on again, the same channel will be received at that time.

Figure 2:
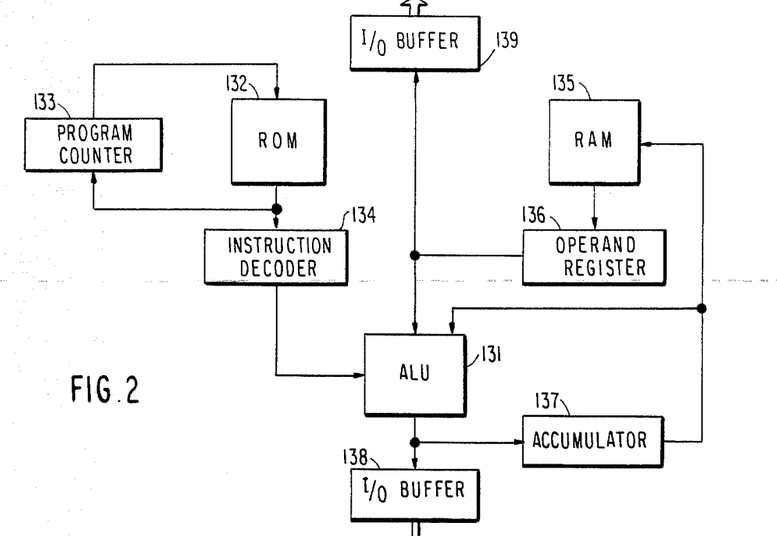
FIG. 2 is a block diagram of the microprocessor used in the tuning system of FIG. 1.

The microprocessor 13 is shown in more detail in FIG. 2 and includes an arithmetic logic unit (ALU) 131, the operation of which is controlled by programs stored in the read only memory (ROM) 132. The programs stored in the ROM 132 are read out under the control of a program counter 133. Each program instruction is sequentially read out of the ROM 132 to an instruction decoder 134 which in turn provides the control commands to the ALU 131. The operands for the arithmetic and logical operations performed by the ALU 131 are temporarily stored in an operand register 136 and an accumulator 137, the latter of which also receives the output of the ALU 131. The operand data is stored in a random access memory (RAM) 135. The microprocessor 13 communicates with the I/O 17 and the EAROM 19 via the buffers 138 and 139. The microprocessor further includes a clock (not shown) for timing internal operations. In implementing the invention, a TMS 1400, purchased from Texas Instruments Co., was used to provide the functions of microprocessor 13.

Figure 3:
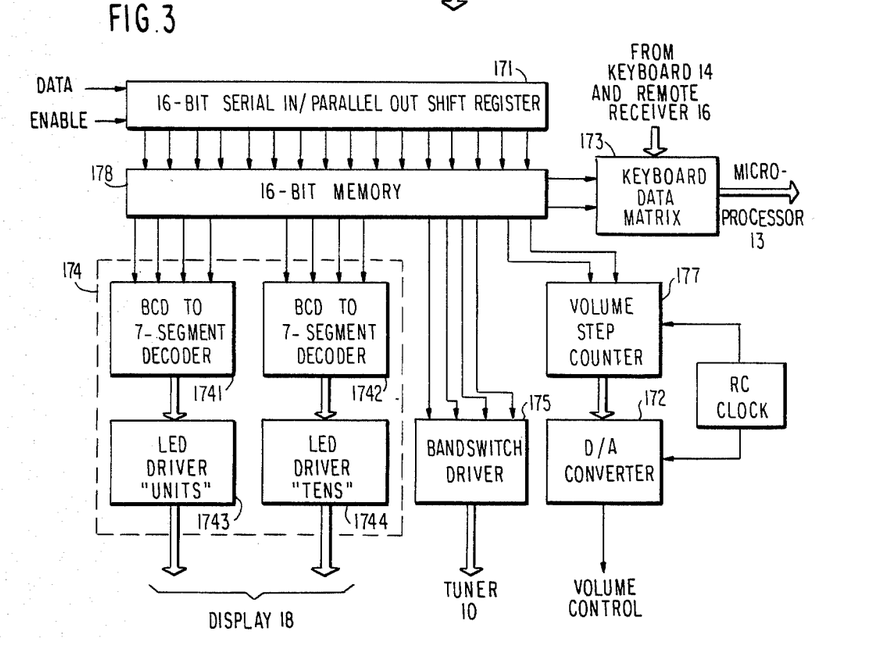
FIG. 3 is a block diagram of the input/output circuit for the microprocessor used in the tuning system of FIG. 1.

As shown in FIG. 3, the I/O 17 contains an input shift register 171, a digital-to-analog (D/A) converter 172, a keyboard data multiplexer 173, a LED display driver 174, a band switch driver 175, and its own internal RC clock. As shown in FIG. 3, the LED display driver comprises a unit's binary coded decimal (BCD) to seven-segment decoder 1741, a ten's BCD to seven-segment decoder 1742, a unit's LED driver 1743, and a ten's LED driver 1744. The D/A converter 172 receives as its input the output of volume step counter 177, and the output of the D/A converter 172 is used for the volume control. Data applied to the input of the I/O 17 is shifted into the sixteen-bit register 171 with each data clock pulse. A data enable pulse causes the entire data contents loaded into the sixteen-bit shift register 171 to be transferred into the internal sixteen-bit memory 178 where it is acted upon by a sixteen-bit code. Data information is outputted from the sixteen-bit memory 178 in accordance with the sixteen-bit code to control keyboard or remote inputs, LED display drivers, band switch driver and audio volume control output.

The tuning system as thus far described is generally conventional. A description in greater detail may be had by reference to "PW Chassis Training Manual", publication No. 29-0507-82, published by General Electric Company, Television Division, Portsmouth, Va. 23705.

According to the channel lockout feature of the present invention, the EAROM 19 has a plurality of single bit locations, one for each possible channel that can be tuned. If the bit is "low", the channel is not locked out and can be accessed at any time. If the bit is "high", the channel is locked out and cannot be accessed unless the correct four digit security code is known. When the microprocessor 13 is instructed to change channels, it reads the information in the EAROM for that channel. If the bit is "high", the microprocessor 13 will not enter the channel or load the programmable constant in the PLL 12 unless the correct four digit security code is also entered. If the bit is "low", the channel is valid and the channel is loaded as usual. The four digit security code is also stored in the EAROM 19. The reason for storing all information in the EAROM 19 is to ensure that the system will remain locked out even when power fails or when the set is unplugged. One preferred programming sequence is described below.

In the following description, user inputs to the microprocessor 13 may be made either by the keyboard 14 or the remote transmitter 15 shown in FIG. 1. Typically, the keyboard 14 and the remote transmitter 15 are provided with ten keys or pushbuttons with numerals 0 to 9 plus other keys or pushbuttons which provide various functional controls. In the symbology used below, a square with a numeral, letter or other symbol within its perimeter indicates a particular key which has been depressed by the user. For example, the symbol [3] means that the key with the numeral 3 has been depressed by the user. The letter D represents any digit 0 to 9, and the letter E and the —symbol are functional keys standing for "enter" and "clear".

In order to lock out channels, the user must perform the following sequence of operations:

| | | |
|---|---|---|
| (A) | [9], [9], [E] | Display will blink for 5 secs., video is noise. (Display will not blink if lockout code had not been selected). |
| (B) | Enter Channels To Be Locked Out<br>[D], [D], [—]<br>OR<br>[D], [—]<br>[D], [D], [D], [—] | Display will be blank on digit entries, blink for 5 secs. after the clear [—] button is pressed, then change to 99. Video is noise. (Will lockout channel of last two digits entered). |
| (C) | Enter 4 Digit Security Code<br>[D], [D], [D],<br>[D], [E] | Display is blank for the 4 digits, then blinks 99 for 5 secs., then returns to last channel viewed or next higher unsecured channel in memory. If previous 4 digit code was selected, new code must be the same. |

The four digit security code may be any combination of four digits chosen by the user. Those skilled in the art will recognize that there are other possibilities for the security code. For example, the code could be a three or five digit number or if alphabet characters are available, the code could be a password.

Once a channel or channels have been locked out, any attempt to access the locked out channel will be prevented by the microprocessor. After each channel entry, the microprocessor 13 checks the information stored in the EAROM 19 to see if the channel is a valid channel or a "locked out" channel. If the requested channel is a valid channel, information is sent to the PLL 12, and the microprocessor program control returns to an "idle" loop to wait for the next command. If the new channel is a "locked out" channel, the display will blink for five seconds and no information will be sent to the PLL 12. The receiver will remain on the previous channel. However, it is possible for the user to access a locked out channel if he knows the correct four digit security code. In order to accomplish this, the user must perform the following sequence of operations:

| | | |
|---|---|---|
| (A) | [D], [E] OR [D], [D], [E] | Video will not change, display will blink locked out channel for 5 secs. |
| (B) | Enter Correct 4 Digit Code<br>[D], [D], [D], [D], [E] | Set will change to locked out channel. Channel can be viewed as long as wanted. Channel is still locked out. |

In order to unlock all channels, the user must perform the following sequence of operations:

| | | |
|---|---|---|
| (A) | [9], [9], [E] | Display will blink 99 for 5 secs. |
| (B) | Enter Correct 4 Digit Code<br>[D], [D], [D], [D], [E] | Set will change back to last viewed channel. All channels are unlocked. |
| (B') | Incorrect 4 Digit Code Entered<br>[D$_1$], [D$_2$], [D$_3$], [D$_4$],<br>[E] | Set will change to channel D$_3$-D$_4$-E. |

-continued (C) If no action is taken in 12 hours, all channels are unlocked and a new 4 digit code can be accessed.
(D) A master key code is available to unlock all channels.

Variations in the foregoing sequences will generally result in previous actions being voided. For example, if the display is 99 or blinking and any one of the buttons for channel up, channel down, volume up, volume down, or on/off are depressed, the result is a return to the last viewed channel with all previous actions being voided. Also, when entering the four digit security code, and five or more digits are entered, all previous actions are voided and the system changes channel to the last two digits entered. In addition, if any action required for an operation does not take place in a timely manner, e.g. 5 seconds, the system automatically reverts to and tunes in the last channel tuned. As will be appreciated, this feature is useful in avoiding inadvertent lockout.

Figures 4A, 4B:
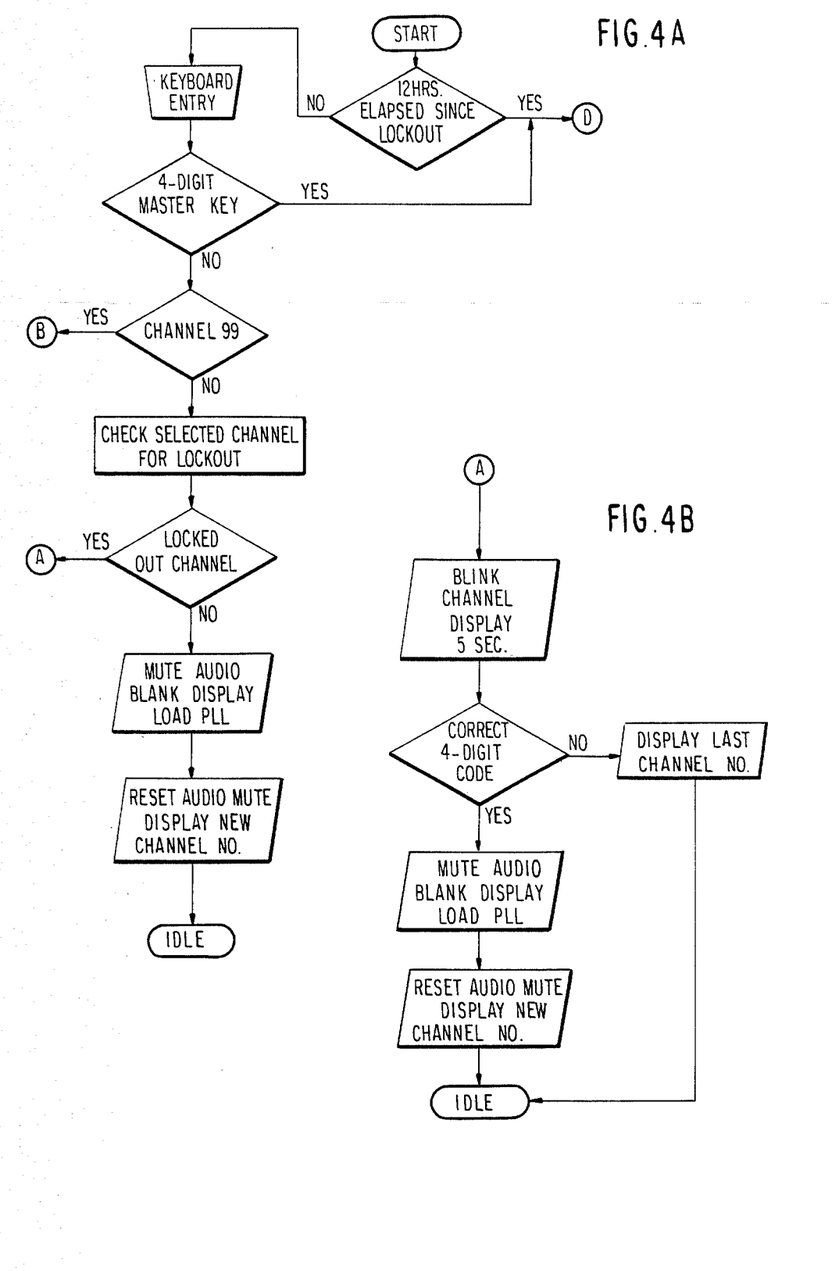
FIGS. 4A–4D are flow diagrams of the microprocessor program incorporating the channel lockout feature according to the present invention.

The flow diagram of the microprocessor program which accomplishes the foregoing operations is shown in FIGS. 4A to 4B. FIG. 4A illustrates normal channel selection operation. The first operation that takes place is a keyboard entry, but it will be understood for the purpose of the illustrated program, a keyboard entry means either a user input via the keyboard 14 or the remote transmitter 15. When a keyboard entry is made, the microprocessor 13 checks to determine whether the four-digit master key has been entered. If not, the microprocessor 13 then checks to determine whether channel 99 has been entered. If not, the microprocessor 13 checks the EAROM 19 to determine if the entered channel bit is "high" indicating that that channel is locked out. If that channel is not locked out, the microprocessor 13 mutes the audio, blanks the channel number display, and loads the PLL with the required programmable constant for the channel number selected. Then the microprocessor 13 resets the audio mute and causes the new channel number to be displayed. At this point, the microprocessor 13 goes into an idle mode and waits for the next command.

Assume now that the channel selected was a locked out channel, in which case the flow diagram proceeds from connector A in FIG. 4A to the same connector in FIG. 4B. Having determined that the channel selected is a locked out channel, the microprocessor 13 causes the display 18 to blink the selected channel number for five seconds. If during that time, no four-digit code is entered or the correct four-digit security code is not entered, the microprocessor 13 will cause the display 18 to display the last channel number and then go into the idle mode. By blinking the locked out channel number for five seconds and then reverting to a display of the last channel number, the user is informed that a locked out channel was selected. On the other hand, if the correct four-digit security code is entered during the five second time period, then the microprocessor 13 will mute the audio, blank the display and load the PLL with the programmable constant for the selected channel. Then the microprocessor 13 will reset the audio mute and cause the display 18 to display the selected channel number. The microprocessor then goes into the idle mode to wait for the next command.

Figure 4C:
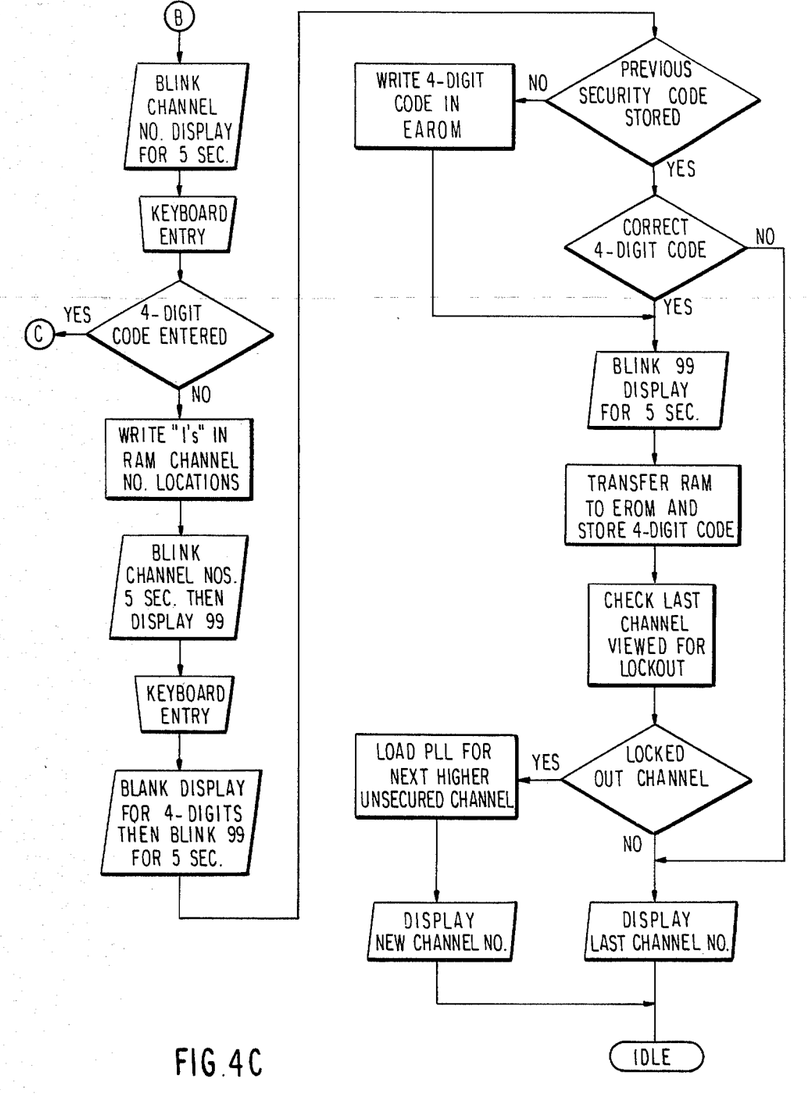

Going back to FIG. 4A, assume that the user has entered channel 99 for the purpose of locking out selected channels. In this case, the program goes from connector B shown in FIG. 4A to the same connector in FIG. 4C. When channel 99 has been entered by the user, the display 18 will blink the channel number for five seconds. If during this time, the user fails to make a further keyboard entry, the microprocessor 13 will simply cause the display 18 to display the last channel number and again enter the idle mode. Assuming however that the user does make a keyboard entry within the five second time period, the microprocessor 13 counts the number of digits entered for each keyboard entry. If less than four digits are entered, the microprocessor 13 writes "one's" in the RAM at the corresponding channel number locations. As each channel number is entered, the microprocessor 13 causes the display 18 to blink the selected channel numbers for five seconds and then again display 99. When the user has entered all of the channel numbers to be locked out, the next keyboard entry will be a four-digit security code. When a four-digit code is entered, the microprocessor 13 causes the display 18 to be blank so that the security code cannot be observed. After the four-digit security code has been entered, the microprocessor shifts the information in the RAM to the EAROM 19 for storage and the microprocessor 13 causes the display 18 to blink 99 for five seconds. The microprocessor 13 also checks the EAROM 19 to determine whether a previous four-digit security code has been stored. If a previous code has not been stored, then the microprocessor 13 causes the newly entered four-digit security code to be stored in the EAROM 19. In the case where a previous security code has been stored, the microprocessor 13 checks to determine if the correct four-digit security code has been entered by the user, and if not, the "one's" just entered in the channel number locations of the RAM are not shifted to EAROM 19. The microprocessor 13 then causes the display 18 to display the last channel number and returns to the idle mode. Assuming, however, that either a previous security code was not stored or that the correct security code has been entered, the microprocessor 13 then causes the display 18 to blink 99 for five seconds and transfers the contents of the RAM to the EAROM for future reference. The microprocessor 13 also checks the EAROM for the last channel viewed to determine whether it has now been locked out. If it has not been locked out, then the microprocessor 13 causes the display 18 to display the last channel number, and loads the required programmable constant. Thereafter, the microprocessor 13 enters the idle mode. If on the other hand the last channel viewed has now been locked out, the microprocessor 13 loads the required programmable constant in the PLL 12 for the next higher unsecured channel. Then the microprocessor 13 causes the display 18 to display the new channel number and returns to the idle mode.

Figure 4D:
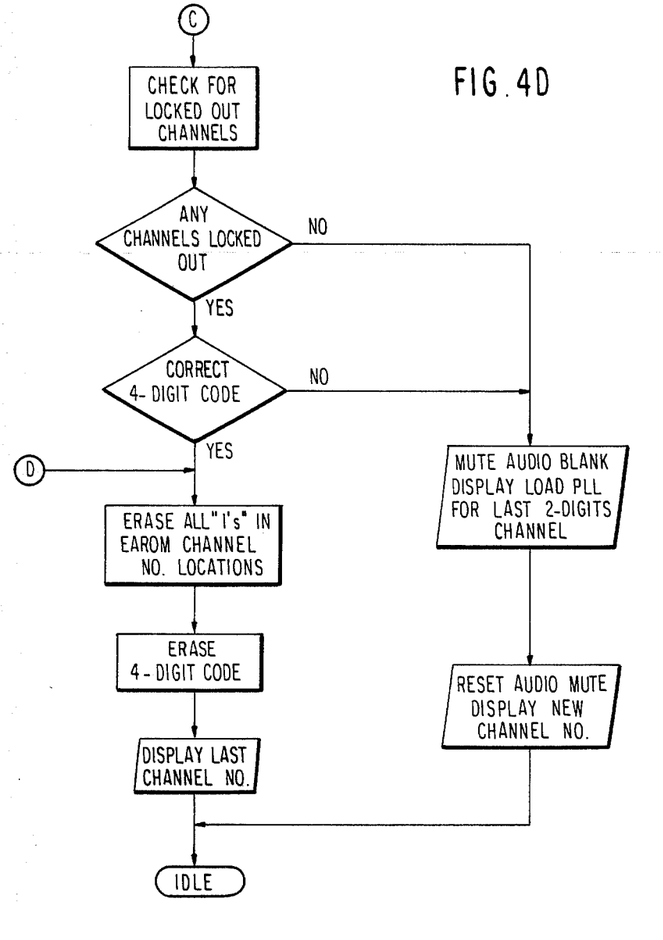

FIG. 4D illustrates the program for erasing locked out channels. The procedure for accomplishing this begins in FIG. 4A when channel 99 has been selected. Going from connector B in FIG. 4A to the same connector in FIG. 4C, the next thing that must be done to effect clearing of locked out channels is for the user to enter a four-digit code. This brings us from connector C in FIG. 4C to the same connector in FIG. 4D. When a four-digit code has been entered after the entry of 99, the microprocessor 13 checks to determine if there are any locked out channels and also whether the correct four-digit security code has been entered. If there are no locked out channels or if the correct four-digit-security code has not been entered, the microprocessor 13 mutes the audio, blanks the display and then loads the PLL 12 for the channel corresponding to the last two digits entered. Then the microprocessor 13 resets the audio mute and displays the new channel number and returns to the idle mode. However, if there are locked out channels and if the user has entered the correct four-digit security code, then the microprocessor 13 erases all of the "one's" from the EAROM 19 channel number locations and the four-digit security code. Then the microprocessor 13 causes the display 18 to display the last channel number, and the microprocessor returns to the idle mode.

As previously mentioned, there are other ways to affect the same clearing of the locked out channels. One of these is automatic when a time of twelve hours has elapsed since the channels were locked out. This is indicated in FIG. 4A when a twelve hour clock is periodically checked by the microprocessor 13. If twelve hours has elapsed, then the program proceeds from connector D in FIG. 4A to the same connector in FIG. 4D. It is also possible to clear all locked out channels by the use of a master key code. This is a code which will be permanently stored in the microprocessor ROM 132 and will be available to repair technicians and sales persons so that television receivers being repaired or displayed for sale may be automatically cleared of any locked out channels. Ordinarily, this masterkey code would not be made available to the purchaser of the television receiver or other viewers in the purchaser's household.

Summarizing, in order to lock out channels in order to control viewer program selection, 99—ENTER is entered via the keyboard 14 or the remote transmitter. The picture being watched will disappear from the screen and the display 18 will blink 99 for five seconds. During this time, the user may selct one or more channels to be locked out. Then, any four digits may be selected as a security code and entered. After the security code has been entered, display 18 will blink 99 for five seconds and return to the last channel viewed, or if that channel has been locked out, to the next higher unlocked channel. The locked out channels cannot be watched for the next twelve hours unless the correct four-digit security code is used. In order to cancel the lock out feature, the user presses 99—ENTER and then the correct four-digit security code. All channels will then be unlocked and the television receiver will change back to the last viewed channels. In order to watch a locked out channel temporarily without affecting the lock out setting, the user enters the desired channel number digits and then enters the four-digit security code. The television receiver will then change to the locked out channel. The channel can be viewed as long as desired, but as soon as the channel is changed or the set is turned off, the channel is again locked out.

The invention has been described for the case of one preferred embodiment. Those skilled in the art recognize that various modifications can be made to the invention as described and that the invention can be applied to other and different electronically tuned receivers. For example, while the invention has been described in terms of an electronically tuned television receiver, the invention could just as easily be applied to an electronically tuned radio receiver. Also, while the specific electronically tuned receiver disclosed in FIGS. 1 and 3 contemplates the use of a LED display for displaying channel numbers and providing interactive feedback to the user, any other type of display could be used. For example, the channel number could be displayed on the CRT of the television receiver rather than providing a separate LED display. Various other modifications will readily suggest themselves to those of ordinary skill in the art.

We claim:

1. A receiver of the type which is electronically tunable to any of a plurality of modulated carrier signals, said receiver comprising a tuner local oscillator the oscillating frequency of which is controlled by a phase lock loop having a programmable frequency divider, a microprocessor responsive to an input indicating the selection of a modulated carrier signal to which the receiver should tune for loading said programmable frequency divider with a programmable constant to cause said local oscillator to oscillate at the required frequency to tune the receiver to the selected modulated carrier signal, and a non-volatile memory connected to said microprocessor for storing information, said microprocessor being responsive to a user entered lockout code sequence for storing in said non-volatile memory information identifying at least one of said plurality of modulated carrier signals the reception of which is to be inhibited and also for storing in said non-volatile memory said user entered lockout code sequence, timing means, said microprocessor being responsive to said timing means to thereafter for a predetermined period of time prohibiting the loading of a corresponding programmable constant in said programmable frequency divider whenever a user input indicates the selection of a modulated carrier signal the reception of which is to be inhibited and when said predetermined period of time has expired, said micrprocessor erasing the information in said non-volatile memory.

2. A receiver as recited in claim 1 wherein said microprocessor is responsive to an erase command to read said lockout code sequence stored in said non-volatile memory and verify said erase command by comparing the lockout code sequence read from said non-volatile memory with a code sequence in said erase command and if said erase command is verified, erasing from said non-volatile memory information identifying modulated carrier signals the reception of which is to be inhibited.

3. A receiver as recited in claim 1 wherein said microprocessor is responsive to the user input indicating a modulated carrier; signal the reception of which is to be inhibited and to read said lockout code sequence stored in said non-volatile memory and verify said user input by comparing the lockout code sequence read from said non-volatile memory with a code sequence in said user input and if said user input is verified, loading the corresponding programmable constant in said programmable frequency divider to permit reception of said modulated carrier signal.

4. A receiver as recited in claim 1 wherein said microprocessor is responsive to a master key code stored in said non-volatile memory for erasing all information in said memory identifying specific modulated carrier signals the reception of which are to be inhibited and also erasing said lockout code sequence.

5. A receiver as recited in claim 1 further comprising means for displaying channel numbers corresponding to modulated carrier signals selected by a user as signals the reception of which is to be inhibited, said channel numbers being displayed for a brief time to confirm to the user the selection thereof.

6. A receiver as recited in claim 5 wherein said means for displaying channel numbers displays for a brief time a channel number corresponding to a user selected modulated carrier signal the reception of which is to be inhibited and thereafter displays the channel number corresponding to a previously selected modulated carrier signal to provide an indication to the user that a modulated carrier signal the reception of which is to be inhibited was selected.

7. A receiver as recited in claim 1 further comprising means for indicating to a user that a modulated carrier signal the reception of which is to be inhibited has been selected.

8. A receiver as recited in claim 1 further including timing means for timing the operation by the user of entering the lockout code sequence and the information identifying at least one of said plurality of modulated carrier signals the reception of which is to be inhibited, said timing means preventing said information and lockout code sequence from being stored in said non-volatile memory if said operation by the user is not accomplished within a predetermined period of time.

9. A receiver as recited in claim 8 further including means for indicating to the user that said information and said lockout code sequence were not stored in said non-volatile memory.

10. An electronically tunable tuner for use in a receiver system, said tuner being tunable to any one of a plurality of modulated carrier signals and comprising a local oscillator the oscillating frequency of which is controlled by a phase lock loop having a programmable frequency divider, a microprocessor responsive to an input indicating the selection of a modulated carrier signal to which the tuner should tune for loading said programmable frequency divider with a programmable constant to cause said local oscillator to oscillate at the required frequency to tune to the selected modulated carrier signal, and a non-volatile memory connected to said microprocessor for storing information, said microprocessor being responsive to a user entered lockout code sequence for storing in said non-volatile memory information identifying at least one of said plurality of modulated carrier signals the reception of which is to be inhibited and also for storing in said non-volatile memory said user entered lockout code sequence, timing means, siad microprocessor being responsive to said timing means to thereafter for a predetermined period of time prohibiting the loading of a corresponding programmable constant in said programmable frequency divider whenever a user input indicates the selection of a modulated carrier signal the reception of which is to be inhibited and when said predetermined period of time has expired, said microprocessor erasing the information in said non-volatile memory.

11. A tuner as recited in claim 10 wherein said microprocessor is responsive to an erase command to read said lockout code sequence stored in said non-volatile memory and verify said erase command by comparing the lockout code sequence read from said non-volatile memory with a code sequence in said erase command and if said erase command is verified, erasing from said non-volatile memory information identifying modulated carrier signals the reception of which is to be inhibited.

12. A tuner as recited in claim 10 wherein said microprocessor is responsive to the user input indicating a modulated carrier signal the reception of which is to be inhibited and to read said lockout code sequence stored in said non-volatile memory and verify said user input by comparing the lockout code sequence read from said non-volitile memory with a code sequence in said user input and if said user input is verified, loading the corresponding programmable constant in said programmable frequency divider to permit reception of said modulated carrier signal.

13. A tuner as recited in claim 10 wherein said microprocessor is responsive to a master key code stored in said non-volatile memory for erasing all information in said memory identifying specific modulated carrier signals the reception of which is to be inhibited and also erasing said lockout code sequence.

14. A tuner as recited in claim 10 further comprising means for displaying channel numbers corresponding to modulated carrier signals selected by a user as signals the reception of which is to be inhibited, said channel numbers being displayed for a brief time to confirm to the user the selection thereof.

15. A tuner as recited in claim 14 wherein said means for displaying channel numbers displays for a brief time a channel number corresponding to a user selected modulated carrier signal the reception of which is to be inhibited and thereafter displays the channel number corresponding to a previously selected modulated carrier signal to provide an indication to the user that a modulated carrier signal the reception of which is to be inhibited was selected.

16. A tuner as recited in claim 10 further comprising means for indicating to a user that a modulated carrier signal the reception of which is to be inhibited has been selected.

17. A tuner as recited in claim 10 further including timing means for timing the operation by the user of entering the lockout code sequence and the information identifying at least one of said plurality of modulated carrier signals the reception of which is to be inhibited, said timing means preventing said information and lockout code sequence from being stored in said non-volatile memory if said operation by the user is not accomplished within a predetermined period of time.

18. A tuner as recited in claim 17 further including means for indicating to a user that said information and said lockout code sequence were not stored in said non-volatile memory.

19. A method of operating an electronically tuned receiver tunable to any one of a plurality of modulated carrier signals, said receiver being of the type having a tuner local oscillator the oscillating frequency of which is controlled by a phase lock loop having a programmable frequency divider, a microprocessor responsive to a user input indicating the selection of a modulated carrier signal to which the receiver should tune for loading said programmable frequency divider with a programmable constant to cause said local oscillator to oscillate at the required frequency to tune the receiver to the selected modulated carrier signal, and a non-volatile memory connected to said microprocessor for storing information, comprising the steps of programming said microprocessor to respond to a user entered lockout code sequence for storing in said non-volatile memory information identifying at least one specific modulated carrier signal the reception of which is to be inhibited and also for storing in said non-volatile memory the user entered lockout code sequence, programming said microprocessor to measure a predetermined period of time beginning from the time said information and said lockout code sequence is stored in said non-volatile memory to thereafter for said predetermined period of time prohibit the loading of the corresponding programmable constant in said programmable frequency divider whenever the user input indicates said modulated carrier signal, and programming said microprocessor to erase the information in said non-volatile memory when said predetermined period of time has expired.

20. The method recited in claim 19 further programming said microprocessor to be responsive to a user entered erase command to read said lockout code sequence from said non-volatile memory and verify said erase command by comparing the lockout code sequence read from said non-volatile memory with a code sequence in said erase command if said erase command is verified, erasing from said non-volatile memory information identifying modulated carrier signals the reception of which is to be inhibited.

21. The method recited in claim 19 further programming said microprocessor to be responsive to a user input selecting a modulated carrier signal the reception of which is to be inhibited followed by said lockout code sequence for loading the programmable constant in said programmable frequency divider to permit reception of said modulated carrier signal.

22. The method recited in claim 19 further programming said microprocessor to be responsive to a master key code sequence for erasing from said non-volitile memory all information identifying modulated carrier signals the reception of which is to be inhibited and also erasing said lockout code sequence.

23. The method recited in claim 19 wherein said electronically tuned receiver further comprises means for displaying channel numbers corresponding to modulated carrier signals selected by a user and further programming said microprocessor to temporarily display the channel number of a user selected modulated carrier signal which is inhibited and thereafter to display the channel number of the last viewed channel to provide an indication to the user that a modulated carrier signal the reception of which is to be inhibited has been selected.

* * * * *